US009472643B2

(12) United States Patent
Ando et al.

(10) Patent No.: US 9,472,643 B2
(45) Date of Patent: Oct. 18, 2016

(54) METHOD TO IMPROVE RELIABILITY OF REPLACEMENT GATE DEVICE

(71) Applicants: INTERNATIONAL BUSINESS MACHINES CORPORATION, Armonk, NY (US); GLOBALFOUNDRIES Inc., Grand Cayman (KY)

(72) Inventors: Takashi Ando, Tuckahoe, NY (US); Eduard A. Cartier, New York, NY (US); Kisik Choi, Hopewell Junction, NY (US); Vijay Narayanan, New York, NY (US)

(73) Assignees: INTERNATIONAL BUSINESS MACHINES CORPORATION, Armonk, NY (US); GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/595,756

(22) Filed: Jan. 13, 2015

(65) Prior Publication Data
US 2015/0126020 A1 May 7, 2015

Related U.S. Application Data

(62) Division of application No. 13/680,257, filed on Nov. 19, 2012, now Pat. No. 8,999,831.

(51) Int. Cl.
| | |
|---|---|
| *H01L 21/3205* | (2006.01) |
| *H01L 29/66* | (2006.01) |
| *H01L 21/28* | (2006.01) |
| *H01L 21/324* | (2006.01) |

(Continued)

(52) U.S. Cl.
CPC ... *H01L 29/66545* (2013.01); *H01L 21/28017* (2013.01); *H01L 21/28088* (2013.01); *H01L 21/321* (2013.01); *H01L 21/324* (2013.01); *H01L 29/4232* (2013.01); *H01L 29/66* (2013.01); *H01L 29/6681* (2013.01); *H01L 29/66795* (2013.01)

(58) Field of Classification Search
CPC .......... H01L 2224/32145; H01L 2924/10253
See application file for complete search history.

(56) References Cited

U.S. PATENT DOCUMENTS

| | | | |
|---|---|---|---|
| 6,872,627 B2 * | 3/2005 | Chen | H01L 21/28079 257/905 |
| 6,921,711 B2 | 7/2005 | Cabral, Jr. et al. | |
| 7,029,966 B2 | 4/2006 | Amos et al. | |

(Continued)

OTHER PUBLICATIONS

M. Chudzik, et al., "High-performance high-k/metal gates for 45 nm CMOS and beyond with gate-first processing," IEEE Symposium on VLSI Technology, Jun. 12-14, 2007, pp. 194-195.

(Continued)

*Primary Examiner* — Zandra Smith
*Assistant Examiner* — Andre' C Stevenson
(74) *Attorney, Agent, or Firm* — Tutunjian & Bitetto, P.C.; Vazken Alexanian

(57) ABSTRACT

A method of fabricating a replacement gate stack for a semiconductor device includes the following steps after removal of a dummy gate: growing a high-k dielectric layer over the area vacated by the dummy gate; depositing a thin metal layer over the high-k dielectric layer; depositing a sacrificial layer over the thin metal layer; performing a first rapid thermal anneal; removing the sacrificial layer; and depositing a metal layer of low resistivity metal for gap fill.

10 Claims, 4 Drawing Sheets

(51) Int. Cl.
*H01L 29/423* (2006.01)
*H01L 21/321* (2006.01)

(56) References Cited

U.S. PATENT DOCUMENTS

| | | | |
|---|---|---|---|
| 7,033,877 | B2 | 4/2006 | Chaudhry et al. |
| 7,704,833 | B2 | 4/2010 | Lindert et al. |
| 7,855,105 | B1 | 12/2010 | Jagannathan et al. |
| 8,110,467 | B2 | 2/2012 | Chang et al. |
| 2005/0250318 | A1 | 11/2005 | Narayanan et al. |
| 2006/0065939 | A1* | 3/2006 | Doczy ............. H01L 21/823828 257/412 |
| 2008/0132039 | A1* | 6/2008 | Cho .................. H01L 21/02381 438/478 |
| 2008/0143906 | A1 | 6/2008 | Allemand et al. |
| 2008/0203498 | A1* | 8/2008 | Takayanagi ....... H01L 21/28026 257/411 |
| 2010/0127336 | A1* | 5/2010 | Chambers ......... H01L 21/28088 257/369 |
| 2010/0330790 | A1 | 12/2010 | Hempel et al. |
| 2011/0309455 | A1 | 12/2011 | Ando et al. |
| 2013/0017678 | A1* | 1/2013 | Tsai .................. H01L 21/28088 438/591 |
| 2013/0087837 | A1 | 4/2013 | Chang et al. |
| 2013/0157452 | A1* | 6/2013 | Chen ...................... H01L 29/78 438/589 |
| 2013/0178022 | A1 | 7/2013 | Cheng et al. |
| 2014/0099784 | A1 | 4/2014 | Kim et al. |

OTHER PUBLICATIONS

K. Mistry et al., "A 45 nm Logic Technology with High-k+ Metal Gate Transistors, Strained Silicon, 9 Cu Interconnect Layers, 193 nm Dry Patterning, and 100% Pb-free Packaging," IEEE International Electron Devices Meeting, IEDM 2007, Dec. 10-12, 2007, pp. 247-250.

C. Ren et al., "A dual-metal gate integration process for CMOS with sub-1-nm EOT $HfO_2$ by using HfN replacement gate," IEEE Electron Device Letters, vol. 24, No. 8, Aug. 2004, pp. 580-582.

W. Tsai et al., "Challenges in integration of metal gate high-k dielectrics gate stacks," in Advanced short-time thermal processing for Si-based CMOS devices II, Proc. ECS, 2004, pp. 321-327.

Non-Final Office Action for U.S. Appl. No. 14/699,427 mailed on Sep. 14, 2015.

Non-Final Office Action for U.S. Appl. No. 14/699,746 mailed on Sep. 10, 2015.

Non-Final Office Action for U.S. Appl. No. 14/699,843 mailed on Sep. 14, 2015.

* cited by examiner

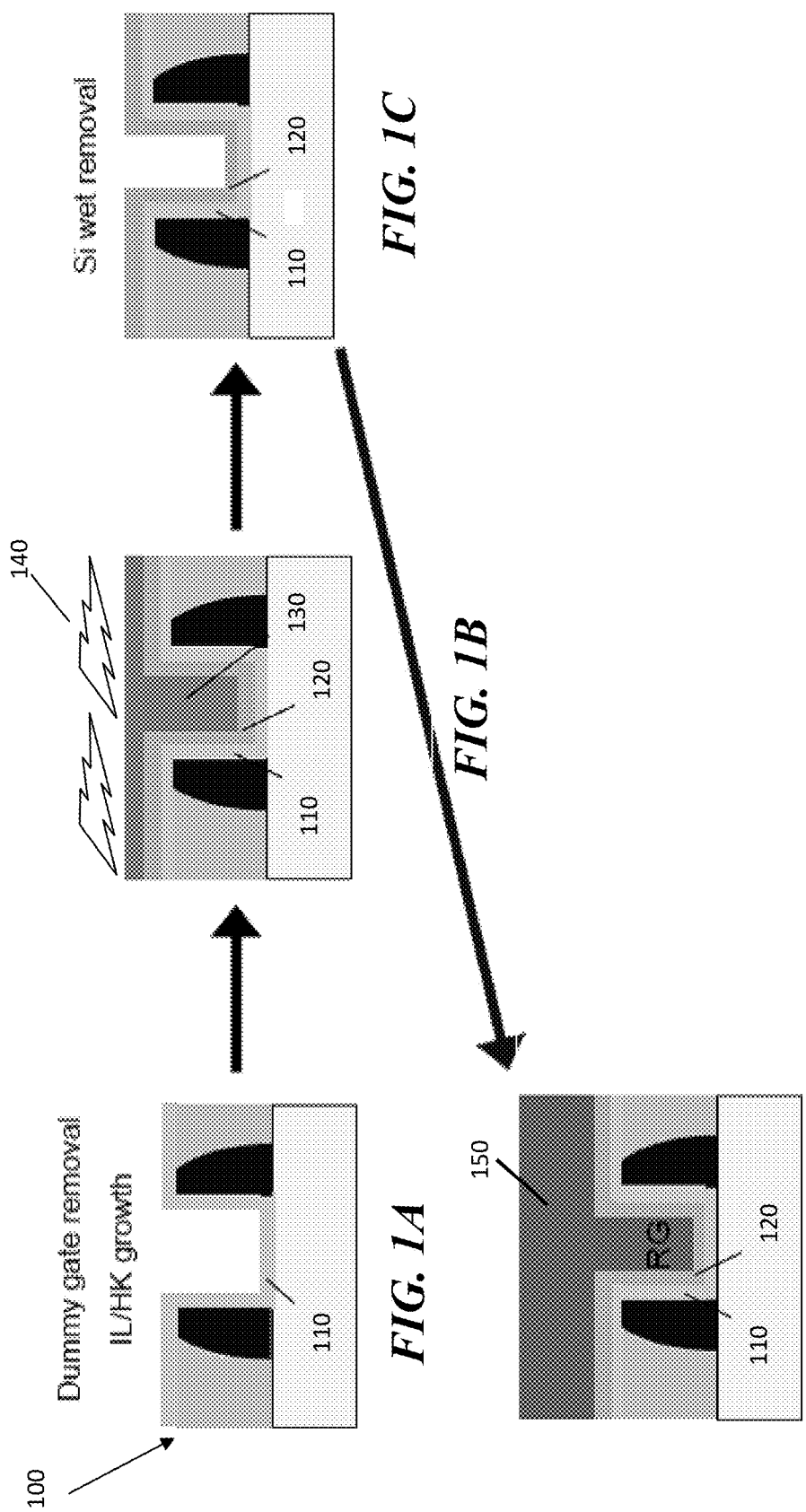

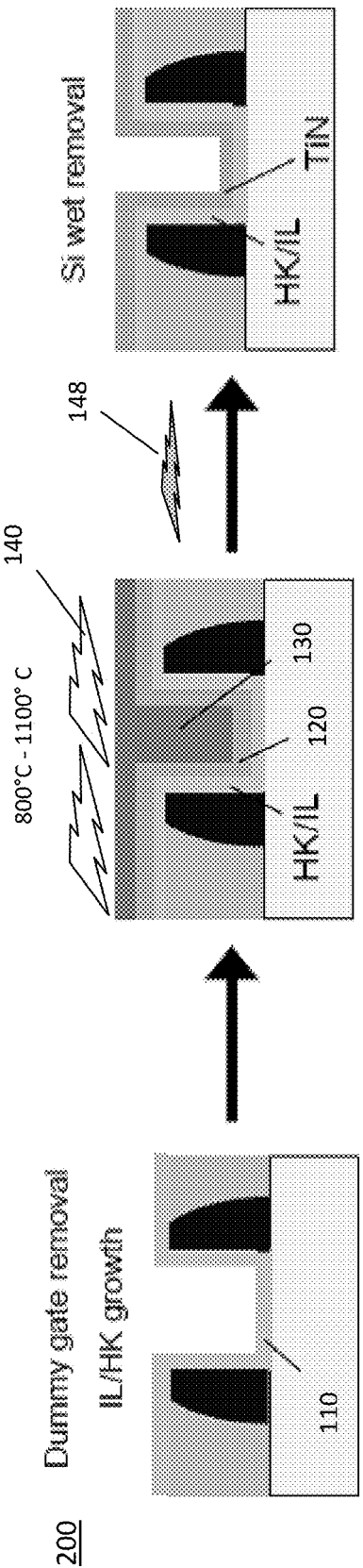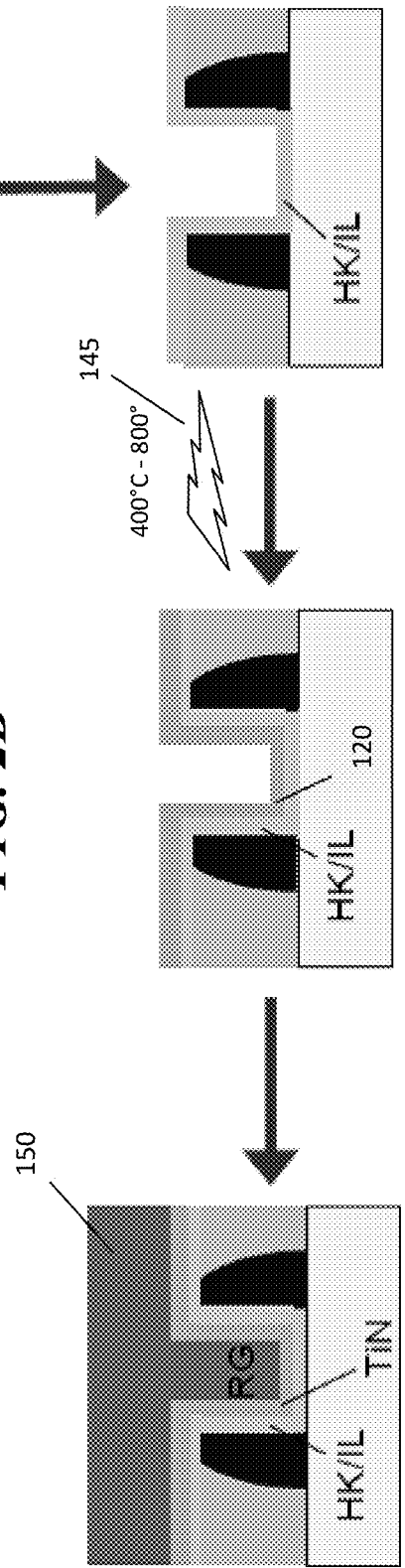

METHOD TO IMPROVE RELIABILITY OF REPLACEMENT GATE DEVICE

CROSS-REFERENCE TO RELATED APPLICATIONS

This application is a division of, and claims priority to, U.S. patent application Ser. No. 13/680,257, filed on Nov. 19, 2012, which application was made by, on behalf of, and/or in connection with the following parties to a joint research agreement: International Business Machines Corporation and GlobalFoundries. The agreement was in effect on and before the date the claimed invention was made, and the claimed invention was made as a result of activities undertaken within the scope of the agreement.

FIELD OF THE INVENTION

The invention disclosed broadly relates to the field of integrated circuit fabrication, and more particularly relates to improving the reliability of high-k transistors using a gate-last fabrication process.

BACKGROUND OF THE INVENTION

In the semiconductor industry, Moore's law states that the number of transistors on a chip doubles approximately every two years. These exponential performance gains present a challenge to the semiconductor manufacturing industry, along with the dual challenges of promoting power savings and providing cooling efficiency. The industry addresses these challenges in multiple ways. Selecting the gate dielectric and gate electrode are critical choices in enabling device scaling, and compatibility with CMOS technology. Two main approaches have emerged in high-k and metal gate (HKMG) integration: gate-first and gate-last. Gate-last is also called replacement metal gate (RMG) where the gate electrode is deposited after S/D junctions are formed and the high-k gate dielectric is deposited at the beginning of the process (high-k first).

A high-k first gate-last process is when the high-k dielectric is deposited first and the metal is deposited last (gate-last method). Gate-last is often referred to as the replacement gate option. "First" and "last"—gate denotes whether the metal gate electrode is deposited before or after the high temperature anneal process. Typically, the reliability of high-k gate stacks improve as a result of dopant activation anneal at a temperature of about 1000° C. However, this annealing process is only used for gate-first or high-k first, metal gate-last processes. The high-k last, metal gate-last process lacks such built-in high temperature treatment and thus reliability is a big challenge.

In the conventional process, if we want to apply a high thermal budget on high-k metals to improve reliability, the high-k metal layer needs to be formed prior to the dopant activation anneal (this is so-called gate-first process). The gate-first process typically requires robust encapsulation (using spacers) of the high-k metal gate stacks to prevent ambient oxygen to affect device characteristics. In addition, the high-k metal gate stack needs to be etched by RIE (reactive ion etching) at the time of gate patterning, which is typically challenging.

We provide a glossary of terms used throughout this disclosure:

GLOSSARY k—dielectric constant value
high-k—having a 'k' value higher than 3.9 k, the dielectric constant of silicon dioxide
RTA—rapid thermal anneal.
A-Si—amorphous silicon
ALD—atomic layer deposition
CMOS—complementary metal-oxide semiconductor
FET—field effect transistor
FinFET—a fin-based, multigate FET
MOSFET—a metal-oxide semiconductor FET
PVD—physical vapor deposition
SiOx—silicon oxide
SiGe—silicon germanide
SiC—silicon carbide
RIE—reactive ion etching
ODL—optically dense layer; organically dielectric layer
STI—shallow trench isolation
S/D—source and drain terminals
NiSi—nickel silicide
C (DLC)—metal-free diamond-like carbon coating
SiN—silicon nitride
TDDB—time dependent dielectric breakdown
NBTI—negative bias temperature instability
PBTI—positive bias temperature instability
RTA—rapid thermal annealing
IL/HK—interfacial layer/high-k dielectric layer
TiN—titanium nitride
TiC—titanium carbide
TaN—tantalum nitride
TaC—tantalum carbide
TiAl—titanium aluminide
N2—nitrogen
Al—aluminide
W—tungsten

SUMMARY OF THE INVENTION

Briefly, according to an embodiment of the invention a method of fabricating a gate stack for a semiconductor device includes the following steps after removal of a dummy gate: growing a high-k dielectric layer over the area vacated by the dummy gate; depositing a thin metal layer over the high-k dielectric layer; depositing a sacrificial layer over the thin metal layer; annealing the structure at a high temperature of not less than 800° C.; removing the sacrificial layer; and depositing a metal layer of low resistivity metal for gap fill. Optionally, a second annealing step can be performed after the first anneal. This second anneal is performed as a millisecond anneal using a flash lamp or a laser.

According to another embodiment of the present invention, a method of fabricating a gate stack for a semiconductor device includes the following steps after removal of a dummy gate: growing a high-k dielectric layer over an area vacated by the dummy gate; depositing a thin metal layer over the high-k dielectric layer; depositing a sacrificial layer over the thin metal layer; annealing the replacement gate structure at a high temperature of not less than 800° C.; removing both the thin metal layer and the sacrificial layer; performing a second rapid thermal anneal, this time at a temperature range between 400° C. and 800° C., inclusive; re-depositing a thin metal layer over the high-k dielectric layer; and depositing a metal layer for gap fill.

According to another embodiment of the present invention, a method of fabricating a gate stack for a semiconductor device includes the following steps after removal of a dummy gate: growing a high-k dielectric layer over an area vacated by the dummy gate; depositing a thin metal layer over the high-k dielectric layer; depositing a sacrificial layer over the thin metal layer; annealing the replacement gate structure at a high temperature of not less than 800° C.; performing a millisecond anneal; removing both the thin metal layer and the sacrificial layer; performing a second rapid thermal anneal, this time at a temperature range between 400° C. and 800° C., inclusive; re-depositing a thin metal layer over the high-k dielectric layer; and depositing a metal layer for gap fill.

According to another embodiment of the present invention, a method of fabricating a gate stack for a FinFET device includes the following steps after removal of a dummy gate: growing a high-k dielectric layer over the area vacated by the dummy gate; depositing a thin metal layer over the high-k dielectric layer; depositing a sacrificial layer over the thin metal layer; annealing the structure at a high temperature of not less than 800° C.; removing the sacrificial layer; and depositing a metal layer of low resistivity metal for gap fill. Optionally, a second annealing step can be performed after the first anneal. This second anneal is performed as a millisecond anneal using a flash lamp or a laser.

According to another embodiment of the present invention, a method of fabricating a gate stack for a FinFET device includes the following steps after removal of a dummy gate: growing a high-k dielectric layer over an area vacated by the dummy gate; depositing a thin metal layer over the high-k dielectric layer; depositing a sacrificial layer over the thin metal layer; annealing the replacement gate structure at a high temperature of not less than 800° C.; performing a millisecond anneal; removing both the thin metal layer and the sacrificial layer; performing a second rapid thermal anneal, this time at a temperature range between 400° C. and 800° C., inclusive; re-depositing a thin metal layer over the high-k dielectric layer; and depositing a metal layer for gap fill.

BRIEF DESCRIPTION OF THE SEVERAL VIEWS OF THE DRAWINGS

To describe the foregoing and other exemplary purposes, aspects, and advantages, we use the following detailed description of an exemplary embodiment of the invention with reference to the drawings, in which:

FIGS. 1A through 1D illustrate a replacement gate formation process, according to an embodiment of the present invention;

FIG. 1A is a simplified illustration of a gate structure after removal of a dummy gate, according to an embodiment of the present invention;

FIG. 1B is a simplified illustration of the gate structure of FIG. 1A after deposition of a gate metal layer and a sacrificial Si layer, followed by a RTA, according to an embodiment of the present invention;

FIG. 1C is a simplified illustration of the gate structure of FIG. 1B after removal of the sacrificial Si layer, according to an embodiment of the present invention;

FIG. 1D is a simplified illustration of the gate structure of FIG. 1C after deposition of a work function metal and gap fill metal, according to an embodiment of the present invention;

FIGS. 2A through 2F illustrate a replacement gate formation process, according to another embodiment of the present invention;

FIG. 2A is a simplified illustration of a gate structure after removal of a dummy gate, according to an embodiment of the present invention;

FIG. 2B is a simplified illustration of the gate structure of FIG. 2A after deposition of a gate metal layer and a sacrificial Si layer, following by a RTA, according to an embodiment of the present invention;

FIG. 2C is a simplified illustration of the gate structure of FIG. 2B after removal of the sacrificial Si layer, according to an embodiment of the present invention;

FIG. 2D is a simplified illustration of the gate structure of FIG. 2C, after removal of the thin metal layer, followed by an optional RTA, according to an embodiment of the present invention;

FIG. 2E is a simplified illustration of the gate structure of FIG. 2D, after deposition of the thin metal layer previously removed, according to an embodiment of the present invention;

FIG. 2F is a simplified illustration of the gate structure of FIG. 2E after deposition of work function and fill metals, according to an embodiment of the present invention;

Figure 3:
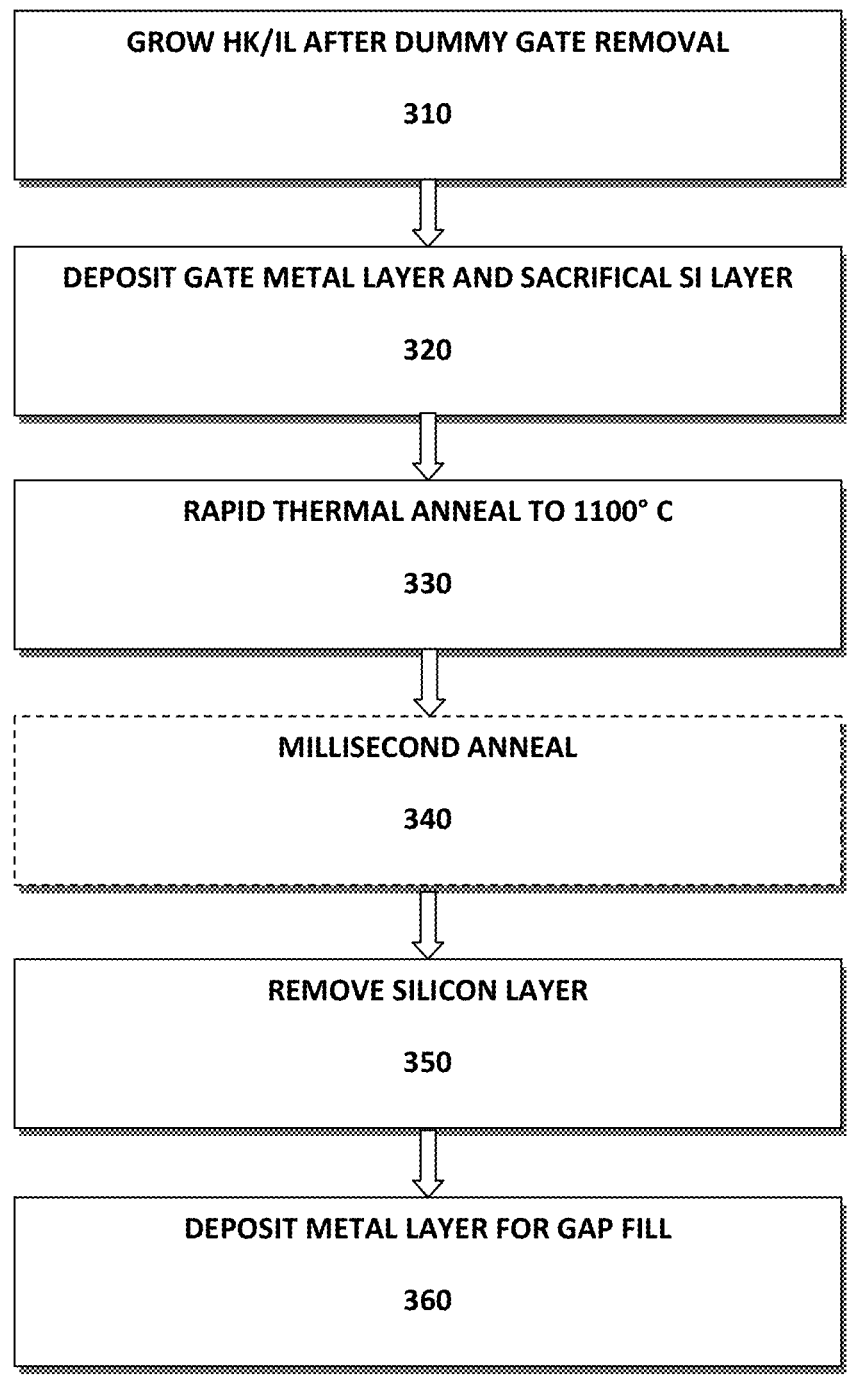
FIG. 3 is a flowchart of the method of forming the replacement gate shown in FIGS. 1A through 1D, according to an embodiment of the present invention.

While the invention as claimed can be modified into alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the scope of the present invention.

DETAILED DESCRIPTION

Before describing in detail embodiments that are in accordance with the present invention, it should be observed that the embodiments have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

We describe a gate-last, high-k metal gate with a novel improvement in reliability. We enable a high thermal budget treatment on high-k metal gate stacks while avoiding the aforementioned challenges of requiring etching at the time of gate patterning, and requiring a robust encapsulation of the high-k metal gate stack. We achieve our reliability improvement by adding a sacrificial layer and a high temperature anneal step to the high-k, gate-last formation process. The sacrificial layer is a silicon (Si) layer that we deposit after removing the dummy gate structure. By employing the sacrificial Si layer, followed by a high temperature anneal (800 to 1100° C.), we thus improve the device reliability. The sacrificial Si layer allows the temperature increase for the anneal process.

We further deviate from known methods in that our replacement gate process is performed without a silicide contact on the gate. Additionally, the high temperature anneal step in this process can be optionally used for the dopant activation traditionally used at the time of the source/ drain junction formation. Then the annealing step usually performed at the source/drain junction formation can be skipped.

Referring now in specific detail to the drawings and to FIGS. 1A through 1D in particular, we show simplified illustrations depicting the replacement gate process, according to one embodiment of the present invention. This embodiment can be advantageously implemented in various CMOS devices, including FinFET devices. In this embodiment, we allow for one additional optional anneal. In FIG. 1A we show the gate structure 100 after removal of the dummy (sacrificial) gate. We grow an interfacial layer and deposit a high-k dielectric 110.

In FIG. 1B, we deposit a gate metal layer 120, followed by deposition of a sacrificial amorphous or poly-crystalline Si layer 130. The gate metal layer 120 in this embodiment is a thin metal layer with a thickness of approximately 10 to 50 angstroms. It is preferably a thermally stable metal alloy, such as TiN, TiC, TaN, or TaC. The gate metal layer 120 can be deposited via atomic layer deposition (ALD) or physical vapor deposition (PVD). After deposition of the thin metal layer 120, and the sacrificial Si layer 130, we follow with a rapid (spike to 5 seconds) thermal anneal at high temperatures ranging from 800° C. to 1100° C. Spike is a type of RTA where temperatures ramp up and down quickly and the duration at the maximum temperature is almost zero. In one embodiment the annealing is performed in ambient nitrogen. After the RTA, we can follow with an optional millisecond anneal, using perhaps a laser anneal or a flash lamp anneal. This optional anneal is carried out for a very short amount of time. Without limiting the process window, we perform this anneal within a range of 1 to 100 milliseconds.

In FIG. 1C we remove the sacrificial Si layer 130, leaving the thin metal layer 120 on the gate structure 100. FIG. 1D we deposit a work function metal and gap fill metal 140 to finish the replacement gate 100. The work function metal 140 can be a metal alloy, such as TiAl or TiN. It serves the purpose of setting the threshold voltage of the device to appropriate values. The gap fill metal 140 can be Al, or W.

The benefits and advantages in using this fabrication process for a gate-last high-k metal gate are:
1. High thermal budget in full replacement gate process.
2. Reliability (PBTI, NBTI, TDDB) improvement;
3. Simplified gate formation process (RIE, encapsulation), which enables closer proximity of stress elements to gate.

Referring now to FIGS. 2A through 2F, we present simplified diagrams of the replacement gate formation process, according to another embodiment of the present invention. This embodiment can also be advantageously implemented in various CMOS devices, including FinFETs. In this embodiment, we allow for two optional annealing processes. FIGS. 2A through 2C are the same steps as in the previous FIGS. 1A through 1C. In FIG. 2A we grow an interfacial layer and deposit a high-k dielectric 110 after removal of the dummy (sacrificial) gate. In FIG. 2B, we deposit a gate metal layer 120, followed by deposition of a sacrificial amorphous or poly-crystalline Si layer 130. The gate metal layer 120 in this embodiment, just as in the previous embodiment, is a thin metal layer with a thickness of approximately 10 to 50 angstroms. It is preferably a thermally stable metal alloy, such as TiN, TiC, TaN, or TaC. The gate metal layer 120 can be deposited via atomic layer deposition (ALD) or physical vapor deposition (PVD).

After deposition of the thin metal layer 120 and the sacrificial Si layer 130, we follow with a rapid thermal anneal 140 at high temperatures ranging from 800° C. to 1100° C. After the RTA 140, we can follow with an optional millisecond anneal 148, using perhaps a laser anneal or a flash lamp anneal. In FIG. 2C we remove the sacrificial Si layer 130, leaving the thin metal layer 120.

In FIG. 2D we remove the thin metal layer 120 in a wet removal process, immediately followed by an optional second RTA 145 at 400° C.-800° C. for 30 seconds in N2 (ambient nitrogen). In FIG. 2E we re-deposit the thin metal layer 120. In one embodiment where we do not perform the optional second RTA 145, we do not need to remove and consequently re-deposit the thin metal layer 120. Lastly, in FIG. 2F we deposit the work function and fill metals 150. This last step correlates to FIG. 1D of the previous embodiment.

FinFET Embodiment

FinFET is commonly used to describe any fin-based, multigate transistor architecture regardless of number of gates. The same process as in the previous embodiment for a planar structure can be applied to a FinFET structure, except that high-k and metal films need to be deposited in a conformal manner to obtain desired device characteristics on the 3-D fin structure. This requirement limits the deposition for the high-k dielectric 110, the gate metal layer 120, and the work function metal 140 to conformal methods, such as atomic layer deposition (ALD).

Figure 4:
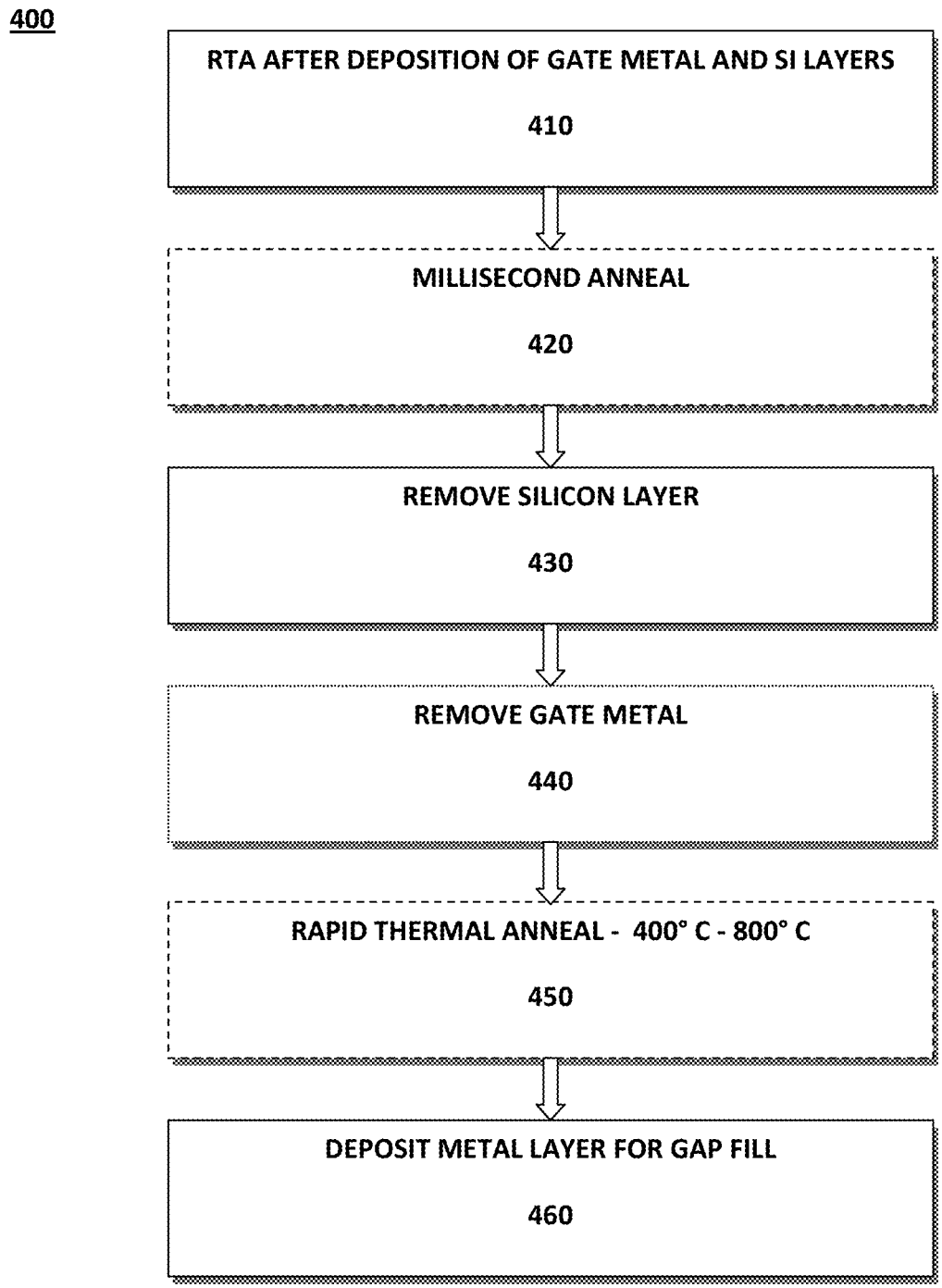
FIG. 4 is a flowchart of the method of forming the replacement gate shown in FIGS. 2A through 2F, according to an embodiment of the present invention.

We will now discuss the process steps for gate last high-k gate fabrication with respect to the flowcharts of FIGS. 3 and 4. Optional steps are depicted in dotted boxes. It will be apparent to those with knowledge in the art that the fabrication of a gate stack on a semiconductor device involves more steps than are shown in FIGS. 3 and 4. For example, we skip over the source/drain junction formation and show the process after the dummy gate has been removed. For clarity, we concentrate our explanation on those steps that deviate from the conventional fabrication of the high-k gate.

Referring now to FIG. 3, we show a flowchart 300 of the process for fabricating a gate-last high-k metal gate 100 according to the embodiment of FIGS. 1A through 1D. In step 310 we grow an interfacial layer and deposit a high-k metal 110 after the dummy gate removal. In step 320 we deposit the gate metal layer 120 and the sacrificial Si layer 130. This is followed by a RTA 140 of 800° C. to 1100° C. in step 330.

Next, we can have a second, optional millisecond anneal 148 in step 340. After the annealing process, we remove the sacrificial silicon layer 130 in step 350. Lastly, we deposit a metal layer 150 consisting of a work function setting metal and a gap fill metal 150 of low resistivity. The benefits and advantages to this embodiment are:
1. Reliability improvement; and
2. Simplification of the gate formation process (RIE, encapsulation), which enables closer proximity of stress elements to gate.

Referring now to FIG. 4, we show a flowchart 400 of the process for fabricating a gate-last high-k metal gate 200 according to the embodiment of FIGS. 2A through 2F. In step 410 we perform the RTA 140 after deposition of the gate metal 120 and Si layers 130. Note that the reason for applying the sacrificial Si layer 130 is to allow the annealing at higher temperatures than would normally be advised. Once the high temperature annealing process is complete, the Si layer 130 can be removed. In optional step 420 we can perform a millisecond anneal 148. We use very high temperatures ranging from 1100° C. to 1300° C. for the millisecond anneal.

In step 430 we remove the sacrificial Si layer 130. Then we remove the gate metal (thin metal layer 120) in step 440. In optional step 450 we can perform a second RTA 145 with temperatures between 400° C. and 800° C. Note that in this case we were able to perform a RTA 145 after removing the Si layer 130 because we did not use such high temperatures. Lastly, we finish the replacement gate in step 460 by depositing the work function and gap fill metals 150 for gap fill using low resistivity metals. The benefits and advantages to the embodiment of FIG. 4 are:

1. lower defect density owing to lift-off effect of Si residue
2. improved manufacturability
3. further recovery of oxygen vacancies in high-k layer by replacing the sacrificial thin metal layer which leads to improved gate leakage/reliability.

Benefits 1 and 2 are due to the removal of the thin metal layer 120 and benefit 3 is due to the combination of removal of the thin metal layer 120 and optional second RTA 145.

Therefore, while there has been described what is presently considered to be the preferred embodiment, it will understood by those skilled in the art that other modifications can be made within the spirit of the invention. The above description(s) of embodiment(s) is not intended to be exhaustive or limiting in scope. The embodiment(s), as described, were chosen in order to explain the principles of the invention, show its practical application, and enable those with ordinary skill in the art to understand how to make and use the invention. It should be understood that the invention is not limited to the embodiment(s) described above, but rather should be interpreted within the full meaning and scope of the appended claims.

We claim:

1. A method of fabricating a gate stack for a semiconductor device, said method comprising steps of:
    after removal of a dummy gate, providing a replacement gate structure by performing steps of:
        growing a high-k dielectric layer over an area vacated by the dummy gate;
        depositing a thin metal layer over the high-k dielectric layer;
        depositing a sacrificial layer over the thin metal layer;
        performing a first rapid thermal anneal of the replacement gate structure at a high temperature of not less than 800° C.;
    removing the sacrificial layer from the thin metal layer to expose an entirety of the thin metal layer directly over a channel region of the semiconductor device; and
    depositing a metal layer of low resistivity metal directly on an entirety of the thin metal layer in the gate stack.

2. The method of claim 1 further comprising:
    performing a second rapid thermal anneal after annealing the structure.

3. The method of claim 2 performing the second rapid thermal anneal comprises performing a millisecond anneal with a laser.

4. The method of claim 2 wherein performing the second rapid thermal anneal comprises performing a millisecond anneal with a flash lamp.

5. The method of claim 1 wherein performing the first rapid thermal anneal comprises annealing at a temperature between 800° C. and 1100° C.

6. The method of claim 5 wherein performing the first rapid thermal anneal further comprises spiking the temperature for a period of time up to five seconds.

7. The method of claim 6 wherein performing the first rapid thermal anneal comprises annealing the structure in ambient nitrogen.

8. The method of claim 1 wherein depositing the metal layer comprises:
    depositing a work function metal; and
    depositing a gap fill metal of low resistivity.

9. The method of claim 1 wherein depositing the sacrificial layer comprises depositing a layer of polycrystalline silicon.

10. The method of claim 1 wherein depositing the sacrificial layer comprises depositing a layer of amorphous silicon.

* * * * *